United States Patent [19]

Kanzaki et al.

[11] 4,404,737

[45] Sep. 20, 1983

[54] METHOD FOR MANUFACTURING A SEMICONDUCTOR INTEGRATED CIRCUIT UTILIZING POLYCRYSTALLINE SILICON DEPOSITION, OXIDATION AND ETCHING

[75] Inventors: Koichi Kanzaki, Kawasaki; Minoru Taguchi, Omiya, both of Japan

[73] Assignee: Tokyo Shibaura Denki Kabushiki Kaisha, Japan

[21] Appl. No.: 210,759

[22] Filed: Nov. 28, 1980

[30] Foreign Application Priority Data

Nov. 29, 1979 [JP] Japan ............................. 54-153601
Nov. 29, 1979 [JP] Japan ............................. 54-153603
Nov. 29, 1979 [JP] Japan ............................. 54-154593
Dec. 21, 1979 [JP] Japan ............................. 54-165494

[51] Int. Cl.³ ................... H01L 21/225; H01L 21/31
[52] U.S. Cl. ................................. 29/577 C; 29/578; 29/580; 29/591; 148/1.5; 148/174; 148/187; 148/188; 156/628; 156/657; 156/662; 357/59; 357/92
[58] Field of Search ............ 29/578, 580, 591, 577 C; 148/174, 187, 188, 1.5; 156/628, 657, 662; 357/59, 92

[56] References Cited

U.S. PATENT DOCUMENTS

| | | | |
|---|---|---|---|
| 3,667,008 | 5/1972 | Katnack ............................ | 357/59 X |
| 3,940,288 | 2/1976 | Takagi et al. ...................... | 148/1.5 |
| 4,084,174 | 4/1978 | Crippen et al. ................... | 357/92 X |
| 4,106,049 | 8/1978 | Shinozaki et al. ................ | 148/175 X |
| 4,139,402 | 2/1979 | Steinmaier et al. ............... | 148/188 |
| 4,148,055 | 4/1979 | Edlinger et al. .................. | 357/92 X |
| 4,157,269 | 6/1979 | Ning et al. ........................ | 148/174 X |
| 4,160,989 | 7/1979 | Brebisson et al. ................ | 357/92 X |
| 4,190,466 | 2/1980 | Bhattacharyya et al. ........ | 148/188 X |
| 4,210,993 | 7/1980 | Sunami ............................. | 29/578 X |

OTHER PUBLICATIONS

Berger et al., "Investigation—MTL/I²L", IEEE J. Solid State Circuits, vol. SC-14, No. 2, Apr. 1979, pp. 327-336.
Isaac et al., "Method for Fabricating Self-Aligned . . . Transistor", I.B.M. Tech. Discl. Bull., vol. 22, No. 8a, Jan. 1980, pp. 3393-3396.

*Primary Examiner*—W. G. Saba
*Attorney, Agent, or Firm*—Finnegan, Henderson, Farabow, Garrett & Dunner

[57] ABSTRACT

A method for manufacturing a semiconductor integrated circuit includes diffusing an impurity of a second conductivity type into polycrystalline silicon layers formed on a first conductivity region in a substrate to form second conductivity regions, the polycrystalline silicon layers constituting first electrode wirings to the second conductivity regions; forming a thick oxidation film on the polycrystalline silicon layers and a thin oxidation film on the exposed surface of the substrate by a heat oxidation treatment; and removing the thin oxidation film to form a second electrode wiring to the first conductivity region, said second electrode wiring being insulated from the polycrystalline silicon layers by the thick oxidation film. The method provides integrated circuits such as I²L circuits which are capable of high speed operation and a high packaging density.

8 Claims, 19 Drawing Figures

METHOD FOR MANUFACTURING A SEMICONDUCTOR INTEGRATED CIRCUIT UTILIZING POLYCRYSTALLINE SILICON DEPOSITION, OXIDATION AND ETCHING

BACKGROUND OF THE INVENTION

The present invention relates to a method for manufacturing a semiconductor integrated circuit in which the packaging density is high and high speed operation is possible.

In the manufacture of integrated circuits, the quality of integrated circuits is being improved by reducing the parasitic capacity, raising the packaging density or forming a suitable impurity profile. For example, it is known that the adoption of the oxidation film isolating technique can reduce the parasitic capacity of the base region and the epitaxial layer, and as compared with the p-n isolation technique, the insulating distance between the transistors may be reduced and the surface of the integrated circuit element may be flattened. It is also known to use polycrystalline silicon doped with an impurity as a diffusion source to form a shallow diffusion layer in a well controlled manner, and to use the polycrystalline silicon as electrode wiring.

A manufacturing method for a conventional bipolar integrated circuit utilizing such techniques will be described taking an Integrated Injection Logic (to be referred to as an I$^2$L for brevity hereinafter) as an example. An n$^+$-type buried layer is formed in a p-type silicon substrate and an n-type epitaxial layer is grown thereover. A thick isolating oxidation film is formed between the elements by the oxidation film isolation technique. Boron, which is a p-type impurity, is selectively ion-implanted to form a p$^+$-type injector and a base region. A silicon oxide film is formed on the entire surface of the substrate. A collector impurity diffusion window is formed by etching the oxidation film. A polycrystalline silicon film doped with arsenic, which is an n-type impurity, is deposited on the oxidation film. Arsenic within the polycrystalline silicon film is by heat-treatment diffused into the base region to form n$^+$-type collector regions. The polycrystalline silicon film is selectively etched by photoengraving to form wiring for connecting with the collectors of polycrystalline silicon, and a low temperature oxidation film is deposited on the entire surface of the structure. Thereafter, contact holes for the injector and the base are formed in the silicon oxidation films. By evaporation of aluminum and patterning of the formed aluminum film, second layer wirings are formed connected with the injector and the base region through the contact holes to provide an I$^2$L circuit.

However, with such a conventional method, the arsenic doped polycrystalline silicon is deposited on the silicon oxidation film having a diffusion window, the collector regions are formed using this as a diffusion source, and the first layer wiring (the wiring for connecting the collectors) is formed by photoengraving. Accordingly, the first layer wiring connecting the collector regions necessarily becomes greater than the area of the collector regions. Further, since extra space is necessary for aligning the first layer wiring with the mask, the space between the plurality of collector regions necessarily becomes long. As a result, the packaging density of the I$^2$L circuit is extremely degraded, the area ratio of the collector regions to that of the base region (SC/SB) is decreased, and the current-amplification factor ($\beta$up) is reduced, thereby obstructing high speed operation. Since the second layer wiring to the base region is performed through the contact hole, the resistances of the collector regions far from the base contact becomes greater, so that the base potential drops and the performance of the collectors far from the injector is degraded.

SUMMARY OF THE INVENTION

It is, therefore, the primary object of the present invention to provide a method for manufacturing a semiconductor integrated circuit which enables high packaging density and high speed operation with simple processes.

Specifically, the present invention provides a method for manufacturing a semiconductor integrated circuit comprising the steps of selectively forming a polycrystalline silicon layer containing a second conductivity type impurity on a first conductivity type region formed in a semiconductor substrate; forming both a thick oxidation film on said polycrystalline silicon layer and a thin oxidation film on the exposed part of said substrate by heat oxidation treatment; diffusing said second conductivity impurity from said polycrystalline silicon layer to said first conductivity type region to form second conductivity type regions; etching said oxidation films to leave said thick oxidataion film on said polycrystalline silicon film and to remove said thin oxidation film on the exposed part of said substrate so that holes may be formed; and forming a second electrode wiring layer insulated from a first electrode wiring of said polycrystalline silicon by said remaining oxidation film.

With the method of the present invention, the area of the collector regions may be increased, the SC/SB ratio may be made greater, the current-amplification factor ($\beta$up) may be improved and the packaging density may be improved as compared with the conventional methods. Since the first electrode wiring layer of polycrystalline silicon and the base region other than the surrounding silicon oxidation film are all covered with metal wiring (second electrode wiring layer), base potential drop may be prevented and degradation of the performance (degradation of $\beta$up) of the collectors far from the injector may be prevented. Further, since the method of the present invention does not require the step of forming a hole for the base contact, the method may be made simpler and the base area may be reduced to a minimum.

BRIEF DESCRIPTION OF THE DRAWINGS

This invention can be more fully understood from the following detailed description when taken in conjunction with the accompanying drawings, in which.

DETAILED DESCRIPTION OF THE PREFERRED EMBODIMENT

Figure 1:
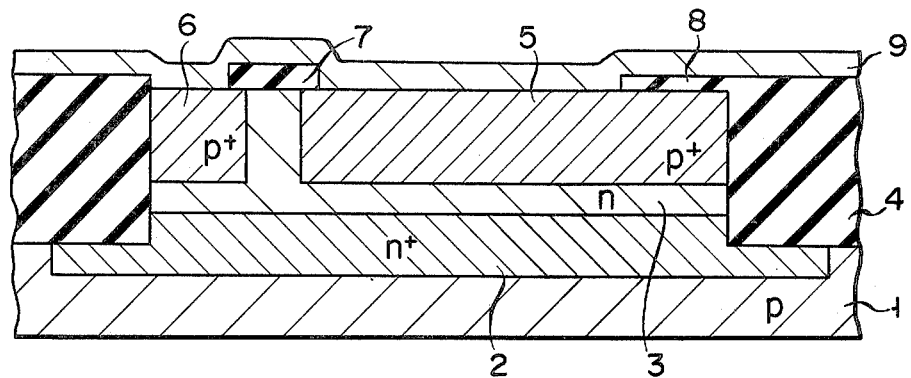
FIGS. 1 to 6 are schematic sectional view illustrating the manufacturing steps of an I$^2$L circuit according to an embodiment of the present invention.

Polycrystalline silicon containing an impurity of a second conductivity type has a heat oxidation speed faster than that of a semiconductor substrate, that is, a first conductivity type region, so that it is capable of growing a thicker oxidation film. Such a polycrystalline silicon includes those doped with an n-type impurity such as arsenic and phosphorus. It is preferable to make the concentration of the doped impurity over $10^{21}/cm^3$ so as to provide an oxidation film on the polycrystalline silicon layer sufficiently thicker than an oxidation film grown on the substrate. Methods for selectively forming such an impurity-doped polycrystalline silicon film on the semiconductor substrate may be: a method in which impurity-doped polycrystalline silicon is deposited by the CVD method or the like; a method in which undoped polycrystalline silicon is deposited by the CVD method and an impurity is ion-implanted or diffused so as to thereafter form the impurity-doped polycrystalline silicon film by selective etching utilizing photoengraving technique; a method in which an impurity-doped polycrystalline silicon film is selectively formed by the lift-off method; and so on. The impurity-doped polycrystalline silicon film thus formed may be used as a diffusion source and as an electrode wiring as it is.

The heat oxidation treatment in the present invention utilizes the difference between the oxidizing rate of the polycrystalline silicon film containing the impurity of the second conductivity type and that of the semiconductor substrate so as to form a thick silicon oxidation film on the polycrystalline film and a thin silicon oxidation film on the exposed part of the semiconductor substrate. Thus, it is preferable to perform this heat oxidation treatment at a temperature which increases the difference between the oxidation rates of the polycrystalline silicon film and the semiconductor substrate. When the temperature of the heat treatment is over 1,000° C., the ratio of the oxidation rate of the polycrystalline silicon film containing the impurity of the second conductivity type to that of the semiconductor substrate (the silicon substrate) becomes small. It is thus preferable to perform the heat oxidation treatment in a dry or wet oxygen atmosphere of a low temperature range of 700° to 900° C. which enables the oxidation rate of the polycrystalline silicon film to be 4 to 10 times that of the substrate. The thick silicon oxidation film is formed around the impurity-doped polycrystalline silicon film, and this silicon oxidation film may be utilized as the insulation film of the second electrode wiring layer deposited in the step to follow. By overall etching of the oxidation films (the thin oxidation film on the exposed part of the substrate and the thick oxidation film on the polycrystalline silicon film) without using the photoengraving method, it is possible to completely remove the thin oxidation film alone and to leave a relatively thick oxidation film on the polycrystalline silicon film. When an electrode wiring material is deposited thereafter, the base region and a plurality of collector regions formed within this region may be isolated by the oxidation film on the polycrystalline silicon film for insulation.

The electrode wiring material used in the present invention may include Al; an Al alloy such as Al-Cu, Al-Si, or Al-Si-Cu; a metal of high melting point such as Mo, W, Ta and Pt; or a metal silicate.

The method of the present invention as applied to the manufacture of an I²L circuit will now be described referring to FIGS. 1 to 6.

As shown in FIG. 1, Sb is selectively diffused in a p-type silicon substrate 1 to form an n⁺-type buried layer 2. After growing an epitaxial layer 3 of n-type silicon, a field oxidation film 4 of 1.5 μm thickness for separating the elements is formed by the oxidation film isolating technique. Then, a dielectric body layer 7 is formed to function as a diffusion mask. Boron is selectively ion-implanted in the silicon epitaxial layer 3 to form a base region 5 and an injector region 6. In this embodiment, an oxidation film 8 extending from the field oxidation film 4 to part of the base region 5 is formed by a conventional method for forming a jumper wiring. However, formation of the jumper wire is not essential in the method of the present invention. Subsequently, an arsenic-doped polycrystalline silicon layer 9 with an arsenic concentration of $10^{21}/cm^3$ and a thickness of 5,000 Å is deposited on the entire surface of the structure as shown in FIG. 1.

Figure 2:
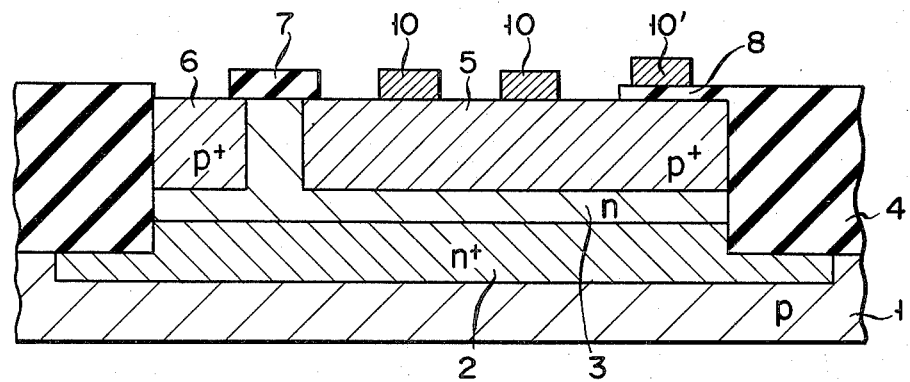
Figure 3:
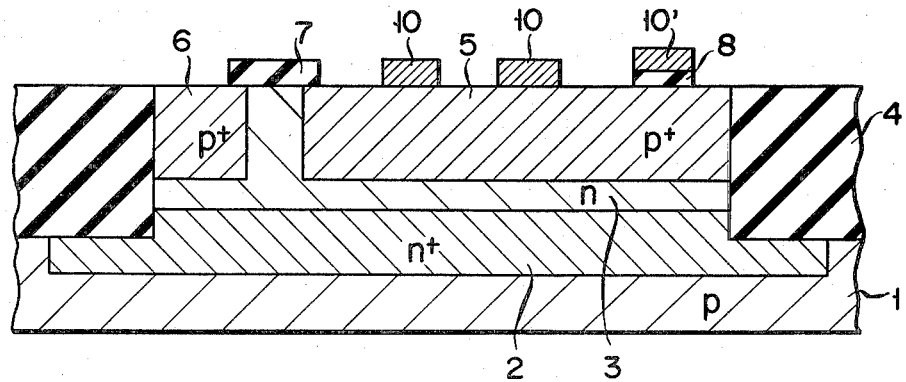

Then, as shown in FIG. 2, the polycrystalline silicon layer 9 is selectively etched in an etching solution of HF—HNO₃ base containing iodine to leave it on the parts of the base region 5 where the collector regions are to be formed and on the part of the oxidation film 8 where the jumper wire is to be formed. The polycrystalline silicon layer is removed from the rest of the surface of the structure. Thereafter, by using the remaining polycrystalline silicon layers 10 and 10' as a mask, the oxidation film 8 near the part for forming the jumper wire is selectively etched as shown in FIG. 3.

Figure 4:
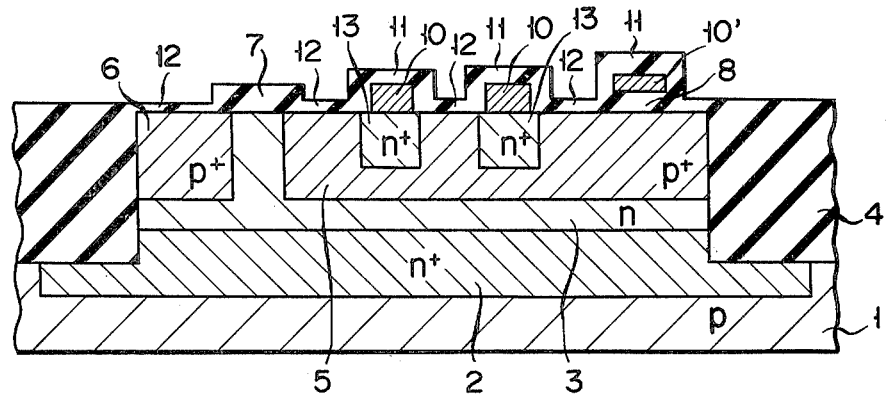

A heat oxidation treatment is performed in a wet atmosphere at a low temperature of 700° C. During this procedure, by the oxidation rate difference between the arsenic-doped polycrystalline silicon layers 10 and 10' and the exposed silicon epitaxial layer, a thick silicon oxidation film 11 of 5,000 Å thickness is grown around the arsenic-doped polycrystalline silicon films 10 and 10', and a thin silicon oxidation film 12 of 300 Å thickness is grown on the exposed base region 5 and the injector region 6 as shown in FIG. 4. Arsenic is simultaneously diffused from the arsenic-doped polycrystalline silicon layers 10 in contact with the base region 5 to form collector regions 13 as n⁺-type diffusion layers.

Figure 5:
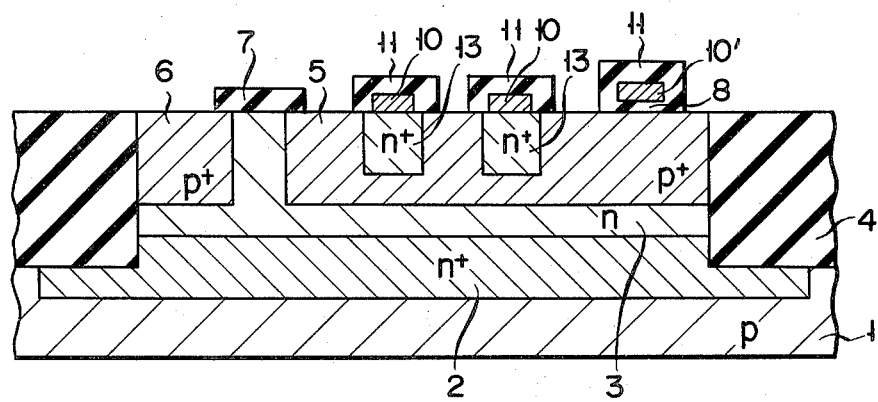
Figure 6:
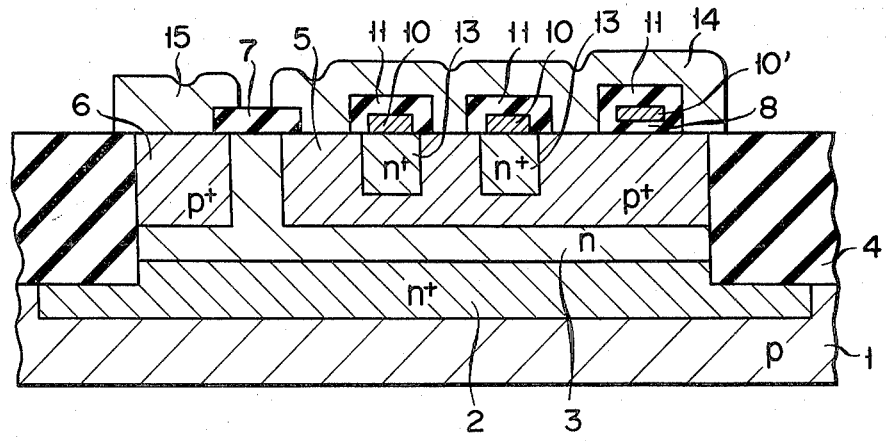
Figure 7:
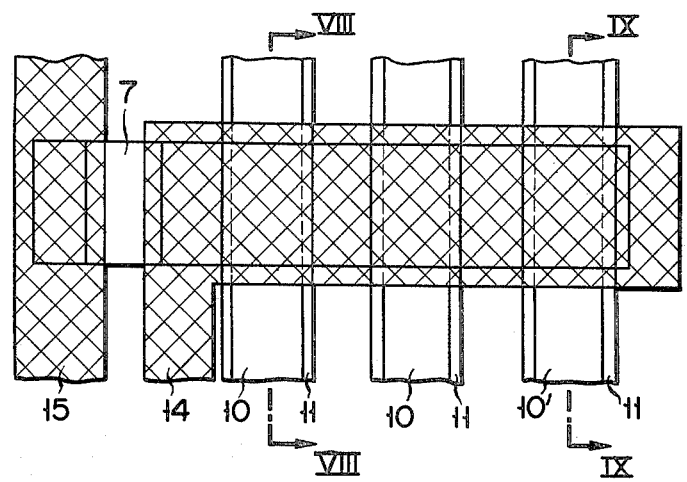
FIG. 7 is a plan view of the I$^2$L circuit of FIG. 6.

The silicon oxidation films are entirely etched with an etching solution without using the photoengraving method. This etching is terminated when the thin silicon oxidation film 12 on the base region 5 and the injector region 6 is completely removed as shown in FIG. 5. As a result, the polycrystalline silicon layers 10 become first electrode wiring layers which are covered with the thick oxidation film 11 and connected to the collector regions 13. The polycrystalline silicon layer 10', insulated from the base region 5 by the oxidation film 8, becomes a jumper wire. Thereafter, an Al film is deposited on the entire surface. The Al film is patterned by the rough photoengraving method on the dielectric film 7 at the boundary of the base region 5 and the injector 6 on the field oxidation film 4. Then, a second Al wiring layer 14 is formed which is insulated from the first electrode wiring layers 10 and the jumper wire 10' by the silicon oxidation film 11 and which is connected with the entire base region 5, and a second Al wiring layer 15 for connecting with the injector region 6 is formed and an I²L circuit is thus obtained. A plan view of the I²L circuit under the condition in FIG. 6 is shown in FIG. 7. The first electrode wiring layers 10 and the jumper wire 10' both of polycrystalline silicon are formed perpendicularly with a second electrode wiring layer 14 of aluminum.

Figure 8:
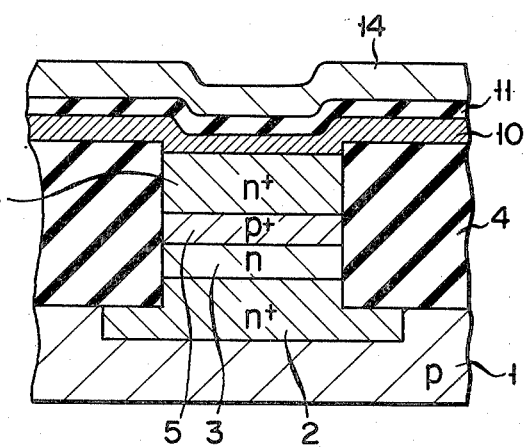
FIGS. 8 and 9 are sectional views along the lines VIII—VIII and IX—IX, respectively, of FIG. 7.
Figure 9:
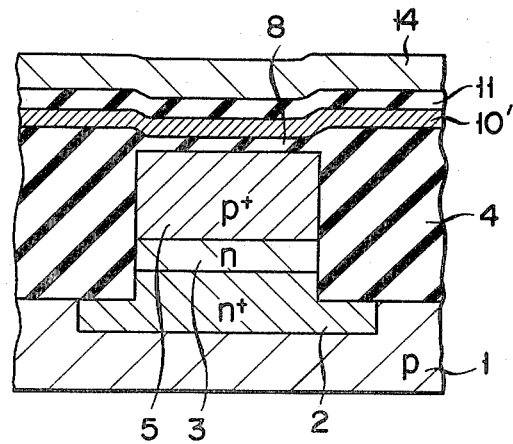

Although the second electrode wiring layer 14 for connecting with the base is formed near the collector regions 13, it is insulated from the first electrode wiring layers 10 for connecting with the collectors and from the jumper wire 10', both of polycrystalline silicon, by the thick silicon oxidation film 11 as shown in FIGS. 8 and 9.

Several other embodiments of the present invention will now be described. The embodiments to be described hereinafter are all improvements or modifications of the first embodiment described above and aim to prevent the generation of leakage current between the collectors and the base due to over etching.

Figure 10:
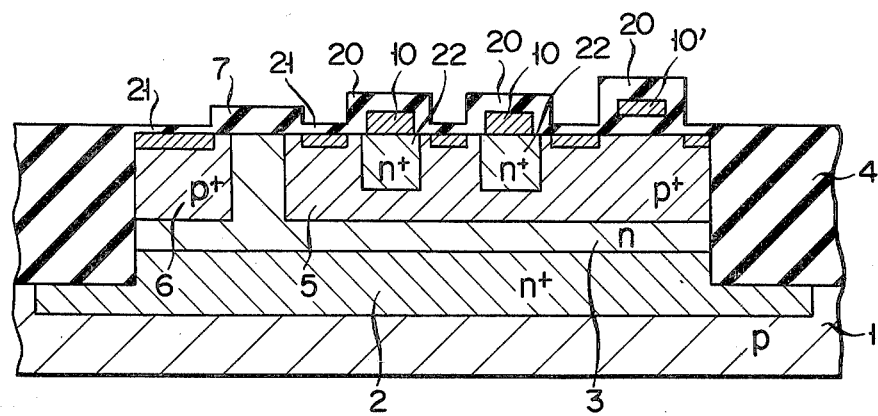
FIGS. 10 to 12 are schematic sectional views illustrating the manufacturing steps of an I$^2$L circuit according to a second embodiment of the present invention.
Figure 11:
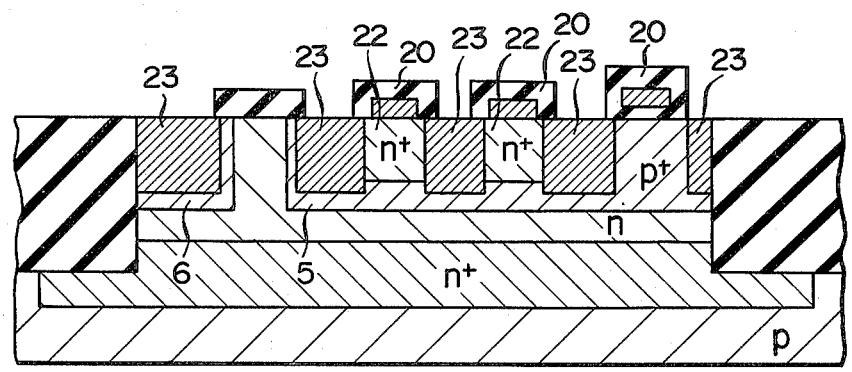
Figure 12:
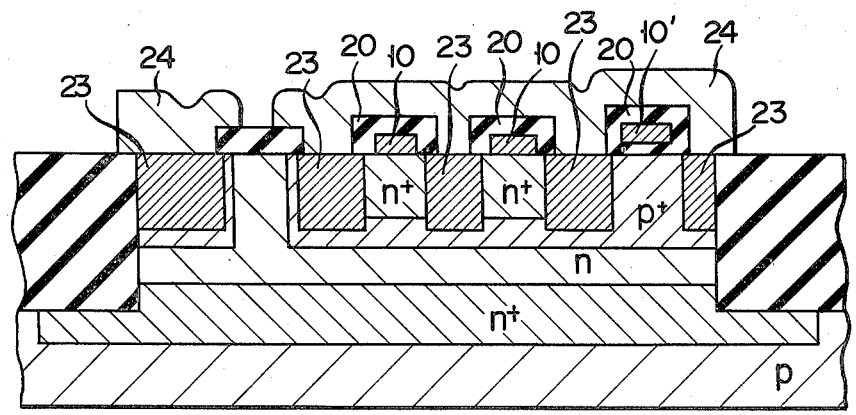

In the second embodiment shown in FIGS. 10 to 12, an acceptor impurity is ion-implanted in the base contact region to form a p-type high impurity concentration region so that contact accidents between the collector regions and the second electrode wiring layer for connecting with the base may be prevented. This method is the same, as in the first embodiment described above, up to the step shown in FIG. 3. Thereafter, a heat oxidation treatment is performed to form a thick oxidation film 20 of 3,000 Å thickness on the arsenic-doped polycrystalline silicon layers 10 and 10' and a thin oxidation film 21 of 300 Å thickness on the exposed part of the semiconductor substrate. Arsenic in the polycrystalline silicon layers 10 is diffused in the substrate to form collector regions 22. Boron is diffused by ion implantation into the base region 5 immediately below the thin oxidation film 21 and into the injector region 6 in a self-alignment manner, as shown in FIG. 10.

Boron implanted by a slamping step including heating is diffused to form p-type high impurity concentration regions 23 as shown in FIG. 11. Then, by etching the oxidation films, the thin oxidation film 21 is removed to leave the thick oxidation film 20 as in the first embodiment. Aluminum electrode wirings 24 are formed in contact with the injector and the base region through the holes formed by the removal of the thin oxidation film 21 in a self-alignment manner, as shown in FIG. 12.

In this second embodiment, contact holes formed in a self-alignment manner to the base region 5 and the injector region 6 do not contact the n-type collector regions 22 due to the presence of the p-type high impurity concentration region 23 formed in a self-alignment manner by ion implantation. Thus, the short-circuiting of the base and the collectors and generation of the leakage current of the I²L circuit may be prevented, and the reliability of the I²L circuit may be improved.

Figure 13:
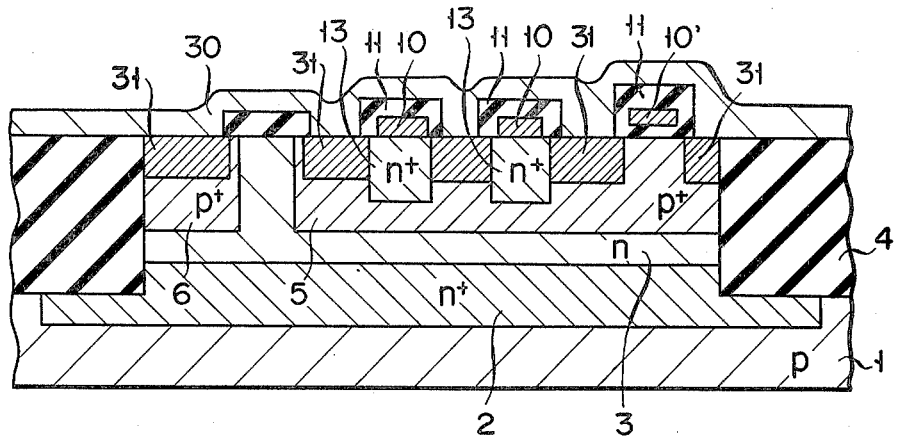
FIGS. 13 and 14 are schematic sectional views illustrating the manufacturing steps of an I$^2$L circuit according to a third embodiment of the present invention.
Figure 14:
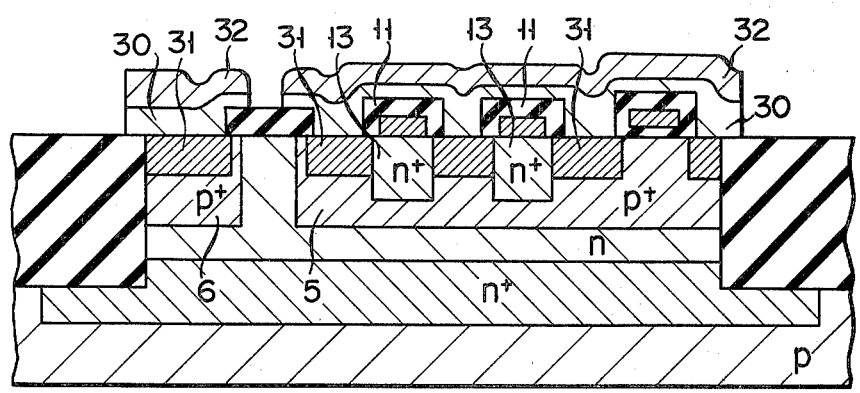

In the third embodiment shown in FIGS. 13 and 14, the second electrode wiring layers for connecting with the base and the injector, are of two layer structure consisting of a lower layer of p-type polycrystalline silicon and an upper layer of a metal, so that short-circuiting of the base and the collectors and generation of leakage current may be prevented. This method may be the same as the method of the first embodiment up to the step of FIG. 5. A p-type polycrystalline silicon layer 30 with boron doped therein is deposited as shown in FIG. 13 on the semiconductor substrate 1 in which the contact holes to the base and the injector are formed in a self-alignment manner between the oxidation films 11 formed on the polycrystalline silicon layers 10. Then, boron is diffused from the p-type polycrystalline silicon layer 30 to the substrate by slamping to form p-type high impurity concentration regions 31 in the base region 5 and the injector region 6. Finally, a metal layer 32 is formed on the p-type polycrystalline layer 30 to form a second wiring layer, as shown in FIG. 14.

In the third embodiment, even when the contact hole to the base region 5 is enlarged to the collector region 13 by over etching the oxidation film, the metal layer 32 and the collector region 13 do not come in contact due to the presence of the p-type polycrystalline silicon layer 30 and the p-type high impurity concentration regions 31. Thus, short-circuiting of the base and the collectors and the generation of the leakage current of the I²L circuit may be prevented.

Figure 15:
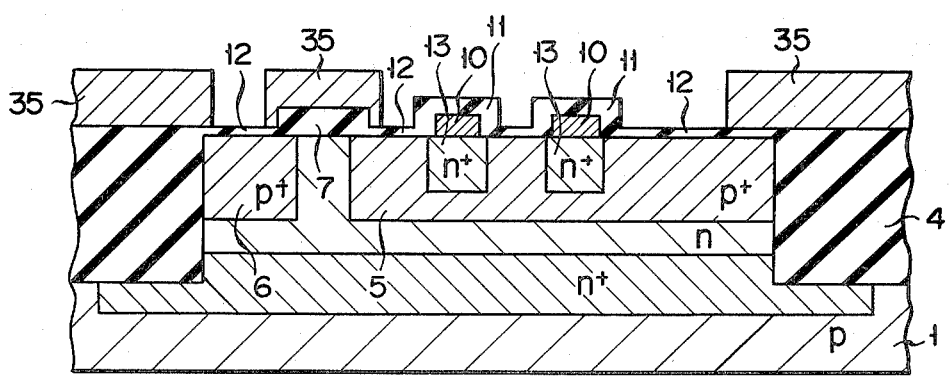
FIGS. 15 to 17 are schematic sectional views of the manufacturing steps of an I²L circuit according to a fourth embodiment of the present invention.
Figure 16:
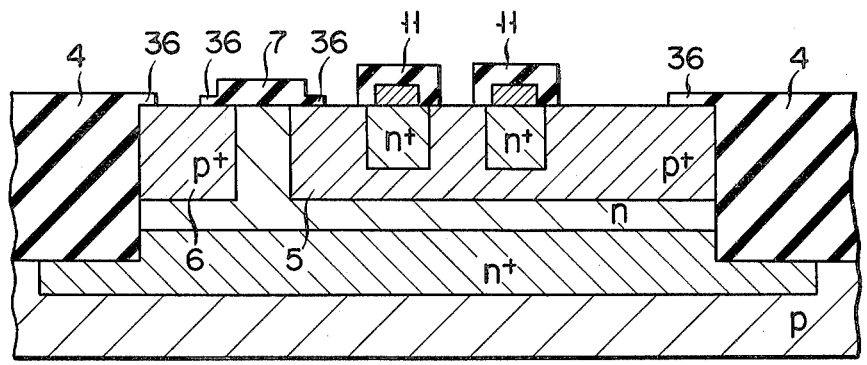
Figure 17:
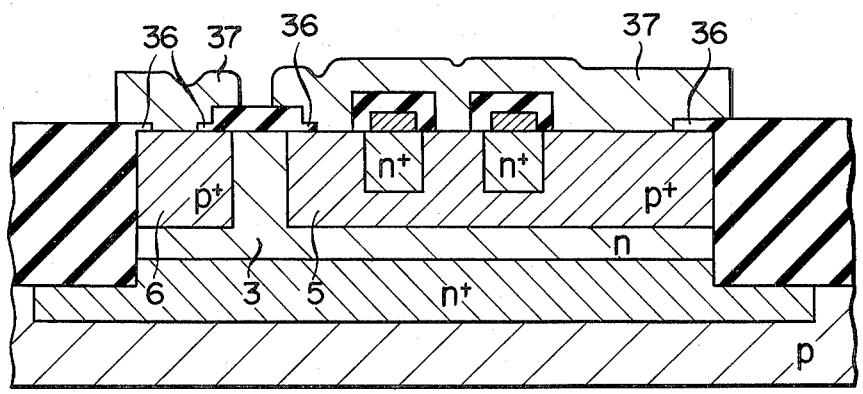
Figure 18:
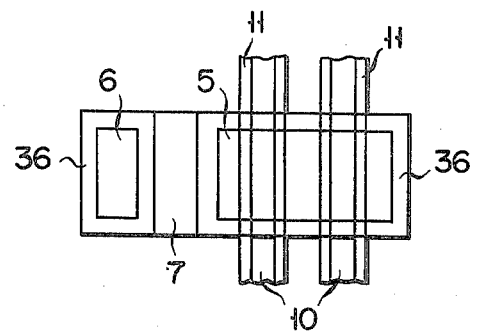
FIG. 18 is a plan view of the I²L circuit under the condition shown in FIG. 16.

In the fourth embodiment shown in FIGS. 15 to 17, the contact hole to the base region is shifted from the boundary between the base region and the field oxidation film to inside the base region, so that contact between the metal wirings for connecting with the base region and the collector regions may be prevented. In this embodiment, the method may be the same as the first embodiment up to the step shown in FIG. 4. The thick oxidation film 11 is formed on the polycrystalline silicon layers 10 and the thin oxidation film 12 is formed on the exposed surface of the substrate 1 by heat oxidation. The n-type impurity is diffused from the polycrystalline silicon layers 10 to the base region 5 to form the collector regions 13. As shown in FIG. 15, before removing the thin oxidation film 12, a photoresist 35 is formed to cover parts of the thin oxidation film 12 inside the boundary between the field oxidation film 4 and the base region 5 or the injector region 6. In FIG. 15, the parts of the thin oxidation film inside the boundary between the dielectric body layer 7 and the base region 5 or the injector region 6 are also covered. When the overall etching is performed under this condition, the thin oxidation film 12 is removed as shown in FIG. 16, the thin oxidation film protruding from the peripheries of the base region 5 and the injector region 6 remain unremoved as eaves 36. Then, second electrode wirings 37 of metal are formed as shown in FIG. 17. FIG. 18 is a plan view of FIG. 16 and illustrates the manner in which the eaves 36 of the thin oxidation film protrude from the peripheries of the base region 5 and the injector region 6 toward the inside thereof.

In this embodiment, short-circuiting and generation of leakage current between the base region 5 and the collector regions 6, or short-circuiting and generation of leakage current between the base region and the epitaxial layer of the I²L circuit may be prevented, which are otherwise caused at the boundary of the field oxidation film 4, or at the boundary of the silicon oxidation film 11 on the n⁺-type polycrystalline silicon layers 10 at the stepped part where the field oxidation film 4 and the n⁺-type silicon layers 10 overlap.

In FIG. 15, instead of the photoresist 35, a dielectric body layer, for example, an aluminum oxide layer or a silicon nitride layer may be deposited and contact holes may be formed using this as an etching mask. In this case, the I²L chip as a whole may be covered with the dielectric body layer remained, or the metal wiring so that the reliability of the I²L chip may be improved. Especially when the base part of the lateral pnp transistor of the I²L circuit (n-type epitaxial layer 3) is covered with silicon nitride, degradation of characteristics due to intrusion of the impurity into the lateral pnp transistor of the I²L circuit and contamination from the package are prevented.

The packaging density of the semiconductor integrated circuit is improved in the present invention. Since the impurity-doped polycrystalline silicon layer used for formation of the collector regions is directly used as the electrode wiring connecting with the collectors, the collector regions and the electrode wiring connecting with the collectors may be formed in a self-alignment manner, and the distance between the respective collectors may be reduced.

Figure 19:
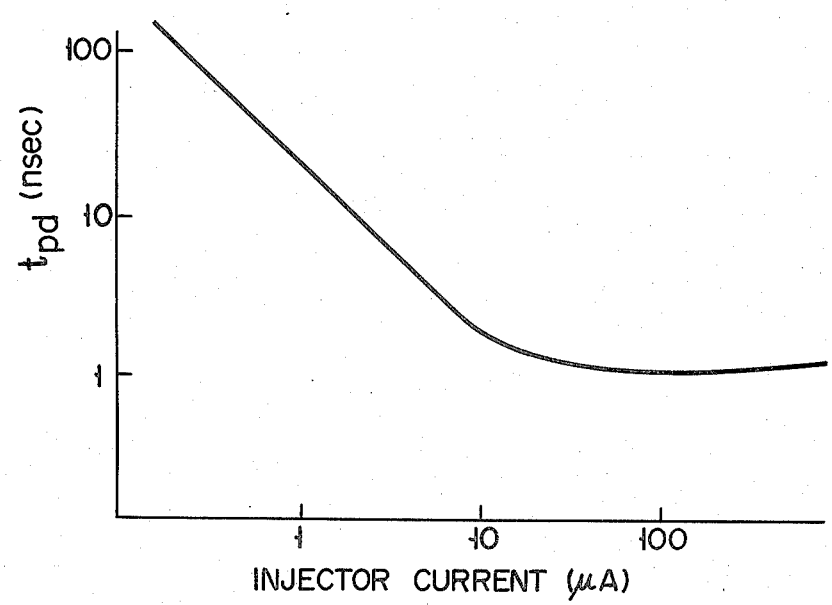
FIG. 19 is an electric power delay curve obtained with an I²L ring oscillator manufactured by the method of the present invention.

The high speed operation of the semiconductor integrated circuit is improved according to the present invention. For example, the conditions required for high speed operation disclosed in the IEEE, Journal of Solid-State Circuit, Vol. SC-14, No. 2, April 1979, pp 327–336 are all satisfied substantially. Since the collector regions are isolated from the base region by the oxidation film formed in a self-alignment manner with the electrodes for connecting with the collectors and formed by heat oxidation on the polycrystalline silicon layer, the base region area may be made smaller and the collector region area may be made greater. Since a plurality of base contact holes are formed near the respective collector regions, the electrode for connecting with the base is connected with the base region at a whole place other than where it is covered by the electrode for connecting with the collectors and the oxidation film formed thereon, so that the base potential drop may be prevented and the degradation of performance of the collector regions far from the injector region may be prevented. As a result, the current amplification factor of the I²L circuit may be improved, the operating speed of the I²L circuit becomes 4 to 5 times that of the I²L circuit obtained by the conventional methods, and the electric power delay product becomes a quarter to one fifth that obtained by the I²L circuit of the conventional methods. FIG. 19 shows the electric power delay curve obtained with an I²L ring oscillator manufactured by the method of the present invention. The propagation delay speed tpd is less than 1 nsec at the minimum value and is seen to be extremely high as compared with that of a circuit obtained by the conventional methods.

Since the step of forming the base contact hole by photoengraving is unnecessary, the productivity may be improved and the base region area may be also reduced to the minimum.

The method of the present invention is not necessarily limited to the I²L circuit of the above embodiments, but can be applied to general bipolar integrated circuits, emitter coupled logic circuits, and so on in a similar manner.

What we claim is:

1. A method for manufacturing a semiconductor integrated circuit comprising the steps of:
   selectively forming a polycrystalline silicon layer containing an impurity of second conductivity type on an exposed surface of a first conductivity type region formed in a semiconductor substrate;
   forming simultaneously both a thick oxidation film on said polycrystalline silicon layer and a thin oxidation film on the remaining exposed surface of said substrated by a heat oxidation treatment;
   diffusing said impurity of second conductivity type from said polycrystalline silicon layer into said first conductivity type region in said substrate to form second conductivity type regions, said polycrystalline silicon layer constituting a first electrode wiring layer connected with said second conductivity type regions;
   removing said thin oxidation film by etching said oxidation films to leave a remaining part of said thick oxidation film on said polycrystalline silicon layers for forming a contact opening to said first conductivity type region; and
   forming a second electrode wiring layer insulated from said first electrode wiring layer of the polycrystalline silicon by said oxidation film remaining thereon and connected with said first conductivity type region through said contact opening.

2. A method according to claim 1, further comprising the step of diffusing by ion implantation and slamping an impurity of first conductivity type through said thin oxidation film formed by a heat oxidation treatment on the exposed surface of said substrate into said first conductivity type region to form a high impurity concentration region of first conductivity type.

3. A method according to claim 1, wherein said second electrode wiring layer is formed by forming a lower layer of polycrystalline silicon containing an impurity of first conductivity type and an upper layer of a metal thereon.

4. A method according to claim 1, further comprising the step of covering, before etching said oxidation films, said thin oxidation film at the peripheries of said first conductivity type region with a photoresist to form eaves protruding inwardly from the peripheries of said region during the etching.

5. A method according to claim 1, further comprising the step of covering, before etching said oxidation films, said thin oxidation film at the peripheries of said first conductivity type region with aluminum oxide or silicon nitride, for forming eaves of said thin oxidation film protruding inwardly from the peripheries of said region during etching, with said aluminum oxide or silicon nitride layer being left.

6. A method according to claim 1, 2, 3, 4, or 5, wherein the concentration of said impurity of second conductivity type contained in said polycrystalline silicon is over $10^{21}/cm^3$.

7. A method according to claim 1, 2, 3, 4, or 5, wherein the heat oxidation treatment for forming said oxidation films on said polycrystalline silicon layer and the exposed surface of said substrate is performed in an oxygen atmosphere at a temperature of 700° to 900° C.

8. A method according to claim 1, wherein said first conductivity type region constitutes the base of an npn transistor and the emitter of a pnp transistor of an I²L gate, and the impurity of second conductivity type is diffused from said polycrystalline silicon layers to said first conductivity type region to form said second conductivity type regions as collectors of said npn transistor.

* * * * *